United States Patent
Chen et al.

(10) Patent No.: US 10,050,435 B2
(45) Date of Patent: Aug. 14, 2018

(54) DRIVER CIRCUIT ABLE TO MONITOR USAGE OF A SURGE PROTECTION ARRANGEMENT

(71) Applicant: PHILIPS LIGHTING HOLDING B.V., Eindhoven (NL)

(72) Inventors: Hong Chen, Shanghai (CN); Hongxin Chen, Shanghai (CN)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/547,824

(22) PCT Filed: Jan. 28, 2016

(86) PCT No.: PCT/EP2016/051828
§ 371 (c)(1),
(2) Date: Aug. 1, 2017

(87) PCT Pub. No.: WO2016/124480
PCT Pub. Date: Aug. 11, 2016

(65) Prior Publication Data
US 2018/0019588 A1  Jan. 18, 2018

(30) Foreign Application Priority Data

Feb. 3, 2015  (WO) ............... PCT/CN2015/072139
Mar. 18, 2015  (EP) ..................................... 15159714

(51) Int. Cl.
*H05B 33/08* (2006.01)
*H02H 9/00* (2006.01)
*H03K 3/017* (2006.01)

(52) U.S. Cl.
CPC ............. *H02H 9/005* (2013.01); *H03K 3/017* (2013.01); *H05B 33/0818* (2013.01); *H05B 33/0887* (2013.01)

(58) Field of Classification Search
CPC ................ H05B 33/08; H05B 33/0815; H05B 33/0845; H05B 33/0818; H05B 33/0887;
(Continued)

(56) References Cited

U.S. PATENT DOCUMENTS 7,542,257 B2 * 6/2009 McCormick ........ H02M 1/4258
361/86
7,961,111 B2 6/2011 Tinaphong et al.
(Continued)

FOREIGN PATENT DOCUMENTS

JP  2011019069 A  1/2011
KR  864892 B1  10/2008
KR  1409479 B1  6/2014

OTHER PUBLICATIONS

"EDN Must Reads LEDs", UBM Tech, UBM Tech, pp. 1-54.
(Continued)

*Primary Examiner* — Thai Pham

(57) ABSTRACT

A driver circuit comprises a mains input and a switch mode power converter for delivering an output derived from the mains input by switching using a pulse width modulation signal. The switch mode power converter comprises a pulse width controller for controlling the pulse width of the pulse width modulation signal. A monitor is used for monitoring the pulse width of the pulse width modulation signal and for detecting a surge event from the pulse width, wherein the monitor is for detecting the surge event from changes in the pulse width and/or duty cycle over time, and comprises a monitor circuit for detecting a surge event based on the pulse width and/or duty cycle reducing to correspond to a first pulse from a second pulse, remaining at the first pulse for a time period falling within a first threshold range and then returning to the second pulse, wherein the width of the first pulse is narrower than the second pulse.

13 Claims, 2 Drawing Sheets

(58) Field of Classification Search
CPC .......... H02M 1/083; H02M 7/00; H02M 7/06; H02M 1/42; H02M 1/4208
See application file for complete search history.

(56) References Cited

U.S. PATENT DOCUMENTS

| | | | |
|---|---|---|---|
| 8,076,920 B1* | 12/2011 | Melanson | H02M 1/4208 315/247 |
| 8,456,138 B2 | 6/2013 | Lei et al. | |
| 2002/0079849 A1 | 6/2002 | Mason et al. | |
| 2011/0096445 A1* | 4/2011 | Truong | H02M 1/32 361/18 |
| 2013/0049589 A1 | 2/2013 | Simi | |
| 2013/0114175 A1 | 5/2013 | Song | |
| 2013/0249397 A1* | 9/2013 | Chandran | H05B 37/0263 315/85 |
| 2015/0022103 A1 | 1/2015 | Kao et al. | |

OTHER PUBLICATIONS

Steve Cherniak, "A Review of Transients and Their Means of Suppression", On Semiconductor, semiconductor Components Industries, LLC, 2001, Mar. 2001, Publ. AN843/D, pp. 1-16.

* cited by examiner

DRIVER CIRCUIT ABLE TO MONITOR USAGE OF A SURGE PROTECTION ARRANGEMENT

CROSS-REFERENCE TO PRIOR APPLICATIONS

This application is the U.S. National Phase application under 35 U.S.C. § 371 of International Application No. PCT/EP2016/051828, filed on Jan. 26, 2016 which claims the benefit of Chinese Patent Application No. PCT/CN2015/072139, filed on Feb. 3, 2015 and European Patent Application No. 15159714.3, filed on Mar. 18, 2015. These applications are hereby incorporated by reference herein.

FIELD OF THE INVENTION

This invention relates to the use of surge protection arrangements in driver circuits, and in particular relates to the counting of surge events to enable the lifetime of such surge protection arrangements to be monitored.

BACKGROUND OF THE INVENTION

It is well known to use surge protection devices to protect electronic circuits from damage during surge events.

The surge current caused by lightning and other power turbulences is a high risk for electronic devices, such as LED drivers and telecommunications devices, which incorporate semiconductor components.

Surge protection devices are used to suppress current surges at the AC input. One common example of a surge protection device is a metal oxide varistor, which has low cost and good performance. When a surge event propagates to the AC power line, the varistor functions to provide a low impedance path to bypass the surge current and clamp the surge voltage.

The lifetime of a metal oxide varistor is however limited and relates to the number of times it has been used to bypass a surge event and the current it has bypassed. When the device has failed, usually it will cause a fuse to break and the AC input is disconnected.

Currently, there are two ways to improve reliability issues caused by the surge protection device. One is to make use of a surge event counter. This provides the number of surge events to the customer. Using this information, the residual lifetime can be estimated. Another way is to use a higher current rating surge protection device.

These solutions are effective but they are costly. They also need additional installation space. For example, a surge counter typically uses a current transformer to pick up the surge signal. This solution is not suitable for small power units such as an LED driver. When selecting a high current rating device, the number of surge events still determines the lifetime of the protection device, and more space is needed for the higher specification component.

US2011/0096445A1 provides a surge current protection circuit. The surge current protection circuit comprises a peak current detector and a current sensing device. The peak current detector detects when a surge current has occurred, by monitoring a change in duty cycle on a node of a HS (high side) switch.

SUMMARY OF THE INVENTION

It would be advantageous to have a surge counting function of low cost and less component/footprint. To better address this concern, the proposed invention is defined by the claims.

According to examples in accordance with an aspect of the invention, there is provided a driver circuit comprising:
a mains input;
a switch mode power converter for delivering an output derived from the mains input by switching using a pulse width modulation signal, wherein the switch mode power converter comprises a pulse width controller for controlling the pulse width and/or duty cycle of the pulse width modulation signal; and
a monitor for monitoring the pulse width and/or duty cycle of the pulse width modulation signal and for detecting a surge event from the pulse width.

The example of the invention utilizes the principle that a surge event is treated by the converter as its input power, and accordingly the converter will adapt its switching behaviour according to the amplitude of the input power. The switching of the converter reflects the magnitude of the input power, including the surge event. Since the surge has a unique amplitude/time waveform different from the normal power supply, the switching of the converter is different and thus is indicative of the surge.

This driver circuit is able to monitor how many surge events (in the mains input) have taken place. In this way, the usage of a surge protection arrangement can be monitored, so that the lifetime of such a surge protection arrangement can be monitored. The monitoring does not require complex additional circuitry, since it can be implemented simply using analysis of the existing pulse width control signal generated by the existing pulse width controller of the switch mode power converter. The example of the invention thus provides a new surge counter method for a switch mode power supply unit, such as used in an LED driver. By monitoring the PWM signal in an LED driver, the surge event can be detected without needing a current transformer. The cost of the surge counter is thus low and almost no additional parts are needed in the driver.

The driver circuit may comprise a rectifier between the mains input and the switch mode power converter. This embodiment provides its application in AC mains.

In an embodiment of the invention, the monitor may be for detecting the surge event from either of:
a narrow pulse having a pulse width and/or duty cycle falling within a first range;
changes in the pulse width and/or duty cycle over time.

By "narrow pulse" is meant a pulse having a short duration/width compared to the normal pulse width of the PWM signal under the circumstance of a normal input power such as the 220/110v AC sine wave, or a small duty cycle compared to the normal duty cycle of the PWM signal under the circumstance of a normal input power such as the 220/110v AC sine wave.

In one example, the monitor circuit is for detecting a spike or noise event based on the pulse width reducing to a narrow pulse width, or the duty cycle reducing to a low duty cycle, within a first range for a minimal duration (i.e. essentially instantaneously). This range may be from zero to a maximum, so that all particularly short PWM pulses or low duty cycles are detected, each corresponding to a particularly high voltage. An instantaneous (minimal) duration may for example be taken to be several μs (1-10 μs) generally smaller than a short duration of tens of μs. Different durations may be used to distinguish between power surges and power spikes/noise. Thus, detection of any narrow pulse is indicative of some form of disturbance at the input, including a spike or noise event and a surge event. Detection of a narrow PWM pulse width and/or duty cycle for a particularly short duration is indicative of a spike or noise event whereas detection of a narrow PWM pulse width and/or duty cycle for a short duration is indicative of a surge event.

The circuit may thus be able to monitor noise and spikes as well as longer surge events.

It would be advantageous to have a more robust and accurate solution in identifying the surge from other power abnormal conditions such as spike, noise, or long term overpower. In another example, the monitor is for detecting the surge event from changes in the pulse width and/or duty cycle over time, and comprises a monitor circuit for detecting a surge event based on the pulse width reducing to a narrow pulse width, or the duty cycle reducing to a low duty cycle from a wide pulse (i.e. with longer pulse width or larger duty cycle than for the narrow pulse), remaining with the narrow pulse characteristics for a time period falling within a range (which can be considered as the short duration as noted above) and then returning to the wide pulse. This is used to detect a series of narrow pulses, and which series lasts for a particular duration.

These sets of conditions may be chosen to represent the change in pulse width and/or duty cycle caused by a surge event, such as a lightning strike. The pulse width and/or duty cycle reduces because there is a high voltage in the mains input, so that the conversion ratio of the switch mode power converter is reduced to deliver the same DC output, but this high voltage has a limited short duration than that of a long term over power but still relatively longer than that of a spike/noise. A characteristic overall duration of the reduced width and/or duty cycle pulses may also be detected.

The time period range or the short duration may fall within the range 25 to 100 µs, more preferably in 50 to 80 µs.

These ranges represent the typical duration of the type of surge event to be detected, such as lightning. This is the primary cause requiring surge protection in outdoor equipment.

The monitor may be adapted to detect a surge event based on the pulse width reducing to the narrow pulse width which has a pulse duty cycle within a first range from a wide pulse width which has a pulse duty cycle within a second range.

This combination of a narrow pulse width and duty cycle may be selected so that it does not arise during normal operation of the switch mode converter when converting between the normal mains input signal (including all expected variations of the normal AC sine wave) and the desired regulated DC output. For example, the first range may be based on a value of half or less than half of the duty cycle range for normal operation of the switch mode power converter when converting the nominal mains signal to the regulated DC output.

For example, the first range duty cycle range may be 0.1 to 0.2 which means a 0.1 to 0.2 duty cycle of the PWM signal is indicative of a high voltage that is considered to be a the surge/spike voltage, and the second duty cycle range may be 0.3 to 0.4 which means a 0.3 to 0.4 duty cycle of the PWM signal is normally the right duty cycle in the case of the input voltage falling within the normal range of the AC mains input power.

The monitor circuit may comprise a logic circuit which provides a detection pulse each time a narrow pulse width is detected, and wherein the detecting is based on monitoring the sequence of detection pulses over the time period range.

This embodiment provides a more detailed implementation on how to detect the short pulse width and/or duty cycle. The monitoring may thus be implemented as a simple logic circuit. It may however also be implemented within the switch mode power converter integrated circuit controller.

The monitor circuit may comprise a pulse counter to monitor the sequence of detection pulses, and wherein the logic circuit comprises:

a signal generator for generating a reference pulse signal with a pulse width each time there is a leading edge of the pulse width modulation signal, the pulse width or the duty cycle of the reference pulse signal corresponding to a threshold;

an AND gate for outputting an AND result of the reference pulse signal and the pulse width modulation signal;

an XOR gate for output an XOR result of the AND result and the reference signal, said XOR result being monitored by said pulse counter to monitor the sequence of pulses in said XOR result.

The pulse counter logic circuit may be used to detect a specific sequence of detection pulses, for example a sequence of 1 s having a length (i.e. number of the pulses) corresponding to a time period falling within the pre-set range. The above function can be easily implemented in the PWM controller of the switch power converter thus the cost is low and does not need to add extra components.

The driver circuit may further comprise:

a surge protection component; and an interface to notify an accumulative number of the detected surges.

The detection of surge events may be used to display the lifetime of the surge protection component to the user.

The surge protection component may be provided on the mains input and may comprise a metal oxide varistor. It should be understood that any other surge protection component is applicable.

In a further embodiment, the pulse width controller may comprise:

a feedback input coupled to the output;

a reference input for receiving a reference; and a comparator for comparing the reference with the output at the feedback input and determining said pulse width and/or duty cycle of the pulse width modulations therefrom.

This embodiment provides a detailed implementation of the pulse width controller.

The present application also provides the application of the invention in lighting applications. More specifically, the driver circuit may comprise an LED driver circuit.

A lighting circuit may comprise the driver circuit as defined above and an LED arrangement powered by the delivered output.

In method aspect, the invention also provides a method of delivering output power, comprising:

converting a mains input and delivering an output by switching the mains input using a pulse width modulation signal;

providing surge protection for surge events arising at the mains input; and monitoring the pulse width and/or duty cycle of the pulse width modulation signal and detecting a surge event from the pulse width and/or duty cycle.

These and other aspects of the invention will be apparent from and elucidated with reference to the embodiment(s) described hereinafter.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a driver circuit comprising a mains input and a switch mode power converter for delivering an output derived from the mains input by switching using a pulse width modulation signal. The switch mode power converter comprises a pulse width controller for controlling the pulse width and/or duty cycle of the pulse width modulation signal. A monitor is used for monitoring the pulse width of the pulse width modulation signal and for detecting a surge event from the pulse width and/or duty cycle.

Figure 1:
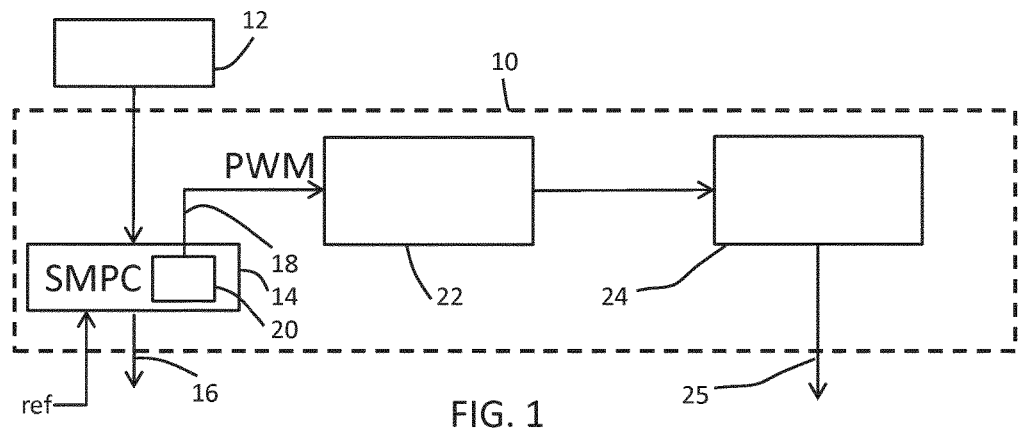
FIG. 1 shows in simplified form an example of driver circuit.

FIG. 1 shows in schematic form an example of the driver circuit 10 of the invention.

The circuit 10 is supplied by a mains supply 12 and includes a switch mode power converter SMPC for delivering an output 16 derived from the mains input by switching using a pulse width modulation signal 18. This pulse width modulation signal 18 is generated by a pulse width controller 20 for controlling the pulse width of the pulse width modulation signal.

A monitor is provided for monitoring the pulse width of the pulse width modulation signal. This monitoring may comprise a comparison function described in more detail below, implemented by comparison circuit 22. The comparison circuit 22 compares the PWM signal pulse by pulse. If the width of adjacent pulses meets certain criterion, a trigger signal is generated which represents a surge event. These surge events can be counted by a counter 24. The counter 24 provides an output signal 25 in the form of an interface to the user which indicates how many surge events have been detected or how many surges the surge protection component can still sustain before replacement.

Figure 2:
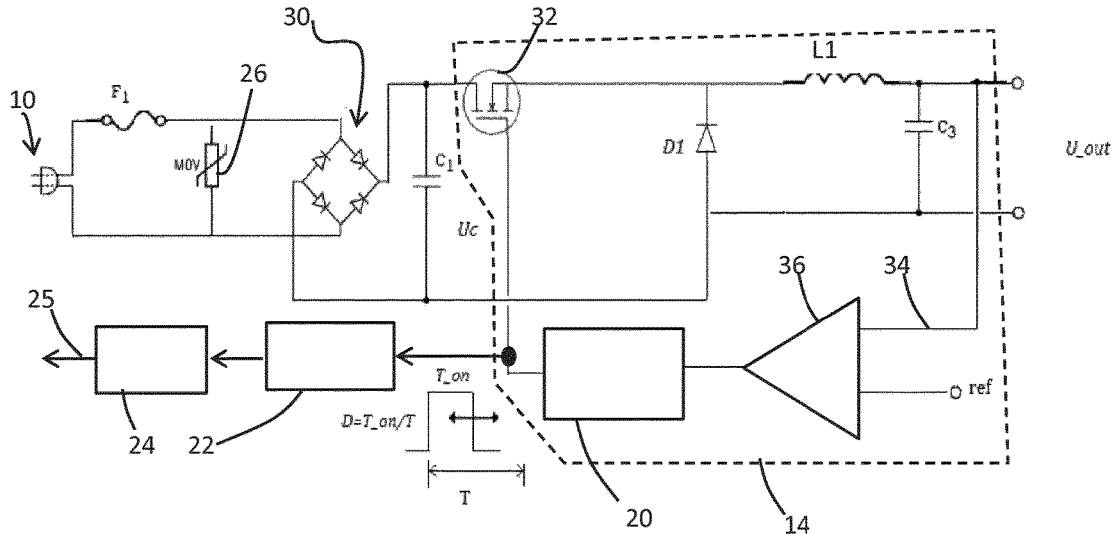
FIG. 2 shows how the driver circuit of FIG. 1 may be applied to an LED driver.

FIG. 2 shows a more detailed example with the circuit of FIG. 1 applied to an LED driver circuit.

The LED driver circuit comprises the mains input 12, which is supplied through a fuse F1 to the metal oxide varistor 26 which provides surge protection. The signal is then rectified by full bridge rectifier 30. The rectified output is smoothed by capacitor C1 and is then provided to the switch mode power converter 14.

In this example, a buck converter is shown which comprises a main switching transistor 32, a freewheeling diode D1 and inductor L1. The switch mode power conversion is controlled by the switching of the transistor 32 in known manner, in particular based on the duty cycle of the gate signal.

The gate signal is generated by the pulse width controller 20. The controller receives a feedback signal 34 which is the voltage at the output and a reference input "ref" which are provided to a feedback amplifier 36. The feedback amplifier compares the output signal with the reference and output an error signal to the pulse width controller 20. If no error is present, the pulse width controller 20 may maintain the present duty cycle/pulse width of the PWM signal, otherwise it can increase or decrease the duty cycle/pulse width.

The switch mode converter operates to provide a voltage shift given by U_out=Uc*d, wherein d is the duty cycle of PWM signal.

Uc is the DC voltage after the rectifier 30.

For a constant voltage driver, the output voltage U_out is controlled to be constant. Thus, the duty cycle d is controlled in proportion with the inverse of the input voltage Uc. Thus, if Uc is increased, the duty cycle d will decrease.

For example, if U_out is set at 100V, d will be changed to 0.33 if Uc is at 300V. The duty cycle d will reduce from 0.33 to 0.286 if U_c increases up to 350V.

In the switch mode power converter, the duty cycle of the PWM signal is adjusted automatically by the pulse width controller 20 as the input voltage changes. By changing the duty cycle d of the PWM signal, the output can be fixed regardless of the input voltage.

In normal conditions, the duty cycle of the PWM signal is a constant or within a certain scope because the AC input is stable within a proper range and the DC output is fixed. If the on-time of the PWM pulses changes to an abnormally small value (i.e. a low duty cycle) while the output remains the same, there must be a high voltage event at the AC input side.

In real applications, such a surge may indeed happen at the AC side. Although the surge clamp device 26 is used to clamp the AC input voltage, it still has a high residual voltage which is above the AC rated voltage. The reason is that the surge protection device is never an ideal component and it has certain impedance according to its characteristic V-I curve. The residual voltage caused by a surge event will pass through the bridge rectifier 30 and charge the bulk capacitor $C_1$ downstream.

In this way, the input voltage Uc to the switch mode power converter is increased to a higher voltage than the normal value. Since the voltage Uc has increased, the duty cycle of the PWM signal will be reduced by the pulse width controller 20 so as to provide the unchanged output voltage U_out.

In this case, the duration is far below than normal value. For example, if the voltage Uc rises to 600V abnormally and the output voltage is U_out is still being maintained at 100V, the duty cycle of the PWM signal will drop to 0.16 which is below the minimum expected duty cycle for a normal range of fluctuations of the AC input, for example less than 0.33 which corresponds to Uc=300V.

Figure 3:
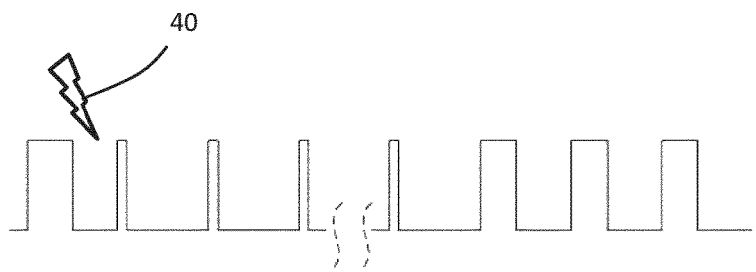
FIG. 3 shows how a surge event influences the PWM signal used within the switch mode power converter.

FIG. 3 shows the PWM signal and shows the reduction in duty cycle in response to a surge event 40. The reduction in duty cycle lasts only as long as the surge event. By way of example, a surge event caused by lightning may have a duration of tens of μs, such as around 60 μs and may cause a residual voltage amplitude over 600V.

Note that the switching frequency of the PWM signal is typically of the order of hundreds of kHz. Typically, the switch mode power converter is designed to operate around a 0.5 duty cycle (for example between 0.3 and 0.6) or slightly below (for example between 0.3 and 0.4).

The surge event can thus be detected by monitoring the duty cycle of the PWM signal. For a fixed frequency PWM signal, this is equivalent to monitoring the pulse width of the ON phase of the PWM signal. A decision criterion is then established to enable discrimination between a real surge, a noise signal or only an input voltage change within normal tolerances.

The key indications are:

(i) The duty cycle (and therefore ON duration) is reduced from a normal value (for example a duty cycle of 0.33) to a reduced value (for example a duty cycle of 0.16).

(ii) The PWM cycles with a narrow pulse last a certain time, for example 50 to 80 µs. As will be discussed later, if the narrow pulse lasts an even shorter time, it may be deduced that it relates to a voltage noise or spike.

(iii) The duty cycle (and therefore ON duration) recovers from the small value to a normal value.

These indications may be used alone or in combination. Thus, the surge event may be detected based on either of:

a narrow pulse width having a pulse width falling within a first range; or changes in the pulse width over time.

The presence of a narrow pulse width alone within a certain range may be representative of a particular voltage surge event which is to be detected. This corresponds to the indication (i) above. Changes in the pulse width over time can be taken into account to measure indications (ii) and (iii) above.

For a spike or noise event based on the pulse width reducing to the narrow pulse width from a wide pulse width, it may additionally be determined if the pulse width remained at the narrow pulse width for a time period less than a first threshold and then returned to the wide pulse width.

In this way, the narrow pulse widths are considered to relate to spike or noise events if the sequence of narrow pulses is of extremely short overall duration.

For a detected event based on the pulse width reducing to the narrow pulse width from a wide pulse width, it may additionally be determined if the pulse width remained at the narrow pulse width for a time period falling within a range (having a non-zero lower limit) and then returned to the wide pulse width.

In this way, the narrow pulse widths are considered to relate to surge events if the sequence of narrow pulses has a particular characteristic time period i.e. duration. This may be used to avoid considering shorter duration noise events as surges, for example noise or spike events at the switching frequency of the switch mode converter.

The time period used to detect surges may fall within the range 25 to 100 µs or more preferably with the range 50 to 80 µs. In other words, the lower limit of the time period may be somewhere between 25 and 50 µs and the upper limit of the time period may be somewhere between 80 and 100 µs.

The surge event may be based on the pulse width reducing to the narrow pulse width which has a pulse duty cycle within a first range from a wide pulse width which has a pulse duty cycle within a second range. Thus, duty cycle measurement can be used instead of pulse width measurement.

For constant switching frequency, measurement of the pulse width is equivalent to measurement of the duty cycle. These will not be equivalent if the switching frequency is not constant. For example the switch mode power converter may apply a constant pulse width and vary the switching frequency to adapt the conversion ratio. The invention can be applied equally to switch mode power converters which operate in this way.

The first range may be 0.1 to 0.2, and the second range may be 0.3 to 0.6, for example 0.3 to 0.4. The second range corresponds to normal operation of the switch mode converter, whereas the first range corresponds to a reduced duty cycle.

The three indications above may all need to be met to detect a surge event. For example if only conditions (i) and (iii) are met, there may be a noise signal such as a voltage spike or noise which is very transient and not so harmful as a surge event.

Figure 4:
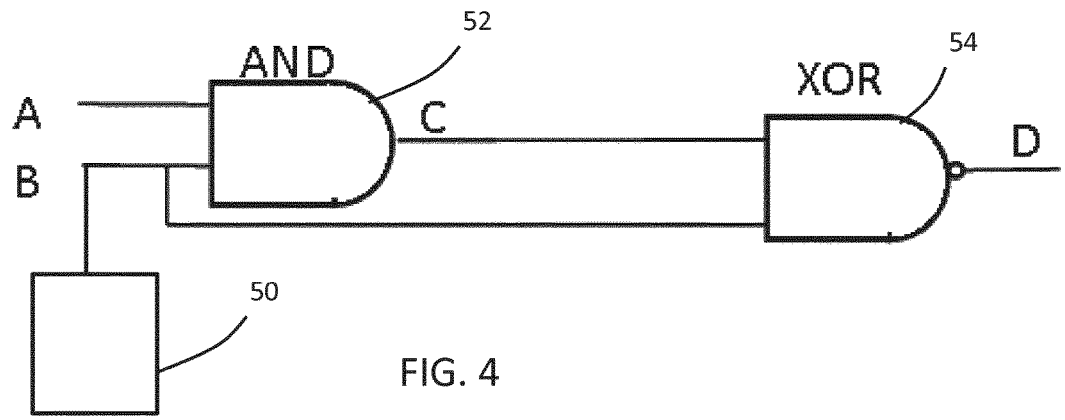
FIG. 4 shows logic circuit used to detect surge events.
Figure 5:
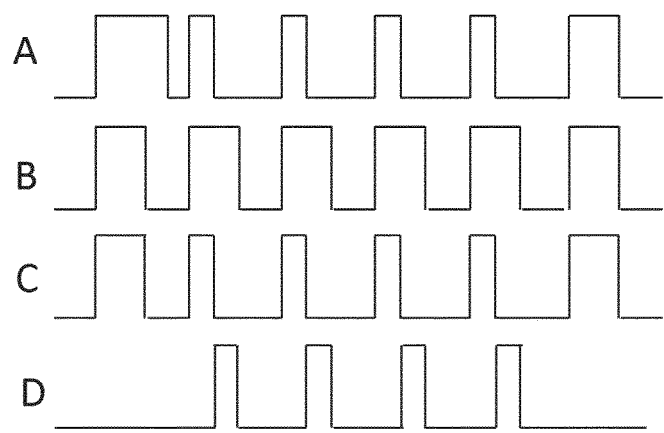
FIG. 5 is a timing circuit to explain the operation of the circuit of FIG. 4.

FIG. 4 shows a logic circuit which may be used to implement the surge detection. FIG. 5 shows the relationship between the signals.

The circuit comprises a pulse counter to monitor the sequence of detection pulses.

A signal generator 50 is used to generating a reference pulse signal with a pulse each time there is a leading edge of the pulse width modulation signal, the pulse width or duty cycle of the reference pulse signal may be a threshold.

An AND gate 52 outputs an AND result of the reference pulse signal and the pulse width modulation signal.

An XOR gate 54 outputs an XOR result of the AND result and the reference signal. The XOR result is monitored by the pulse counter to monitor the sequence of pulses in said XOR result.

The signals are:

A is the PWM signal from the pulse width controller;

B is the reference pulse signal which is created, and is synchronized with the PWM signal A but with a fixed duty cycle. The duty cycle is fixed above a minimum level (for example 0.16) longer than the PWM duty cycle when a surge event occurs but less than normal value (for example 0.33) when no surge event occurs.

C is the output after trimming by AND gate. In some conditions, the duty cycle of the PWM signal A will be greater than the normal value as a result of a low input voltage. Since this is not caused by a surge event, this wider pulse signal will be shaped by the AND gate (i.e. the output is limited to the width of the pulses in the signal A) to remove potential risk in logical operation.

D is the final output after the XOR gate.

If a pulse sequence like "000111 . . . 11000" is detected and the high level "1" lasts for a number of cycles within a range as previously set as a decision criteria, it can be concluded that a surge even took place.

The example above shows a driver circuit which delivers a regulated voltage, and the PWM controller derives a pulse width or duty cycle which is controlled to deliver the desired output voltage. The same approach may be applied to a current regulating driver which aims to deliver a constant current to a load (such as an LED) by controlling a switch mode power converter.

In this case, the feedback 34 can be based on current sensing, for example by providing as feedback signal the voltage across a sense resistor in series with the output terminal. The driver circuit is then controlled to deliver a constant output current. The reference signal input to the feedback amplifier may then for example implement dimming control. Thus, the invention can be applied to current regulating driver circuits or voltage regulating driver circuits.

The invention is applicable to LED drivers as shown in the example above, but it is applicable generally to any driver.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A driver circuit comprising:
a mains input;
a switch mode power converter for delivering an output derived from the mains input by switching using a pulse width modulation signal, wherein the switch mode power converter comprises a pulse width controller for controlling at least one of a pulse width and a duty cycle of the pulse width modulation signal; and
a monitor for monitoring at least one of the pulse width and the duty cycle of the pulse width modulation signal and for detecting at least one of a surge event from the pulse width and a duty cycle, wherein the monitor is for detecting the surge event from changes in the pulse width and/or duty cycle over time, and
wherein the monitor detects a surge event by detecting a change in the pulse width, from a second pulse width to a first pulse width, the first pulse width being maintained for a time period falling within a first threshold range and then returning to the second pulse width, wherein the first pulse width is narrower than the second pulse width; or
by detecting a change in the duty cycle, from a second duty cycle changing to a first duty cycle, the first duty cycle being maintained for a time period falling within a first threshold range and then returning to the second duty cycle, wherein the first duty cycle is smaller than the second duty cycle.

2. The driver circuit as claimed in claim 1, wherein the monitor is for detecting at least one of a spike or a noise event based on at least one of the pulse width and duty cycle reducing to correspond to the first pulse from the second pulse, remaining at the first pulse for a time period falling within a second threshold range and then returning to the second pulse, wherein the second threshold range is shorter than the first threshold range for determining the surge.

3. A driver circuit as claimed in claim 1, wherein the first threshold range falls within the range 25 to 100 μs, more preferably in the range 50 to 80 μs.

4. The driver circuit as claimed in claim 1, wherein the monitor is adapted to detect a surge event based on the duty cycle reducing to correspond to the first pulse which has a duty cycle within a first range from a second pulse which has a duty cycle within a second range.

5. The driver circuit as claimed in claim 4, wherein the first range is a 0.1 to 0.2 duty cycle of a PWM signal, being indicative of a high voltage, and the second range is a 0.3 to 0.4 duty cycle of the PWM signal, being within a normal range of the mains input.

6. The driver circuit as claimed in any claim 1, wherein the monitor comprises a logic circuit which provides a detection pulse each time the first pulse is detected, and wherein the detecting is based on monitoring the sequence of detection pulses over time.

7. The driver circuit as claimed in claim 6, wherein the monitor circuit comprises a pulse counter to monitor the sequence of detection pulses, and wherein the logic circuit comprises:

a signal generator for generating a reference pulse signal with a pulse each time there is a leading edge of the pulse width modulation signal, the pulse width or the duty cycle of the reference pulse signal corresponding to a threshold;
an AND gate for outputting an AND result of the reference pulse signal and the pulse width modulation signal;
an XOR gate for output an XOR result of the AND result and the reference signal, said XOR result being monitored by said pulse counter to monitor the sequence of pulses in said XOR result.

8. The driver circuit as claimed in claim 1, further comprising:
a surge protection component; and
an interface to notify an accumulative number of the detected surges.

9. The driver circuit as claimed in claim 8, wherein the surge protection component is provided on the mains input and comprises a metal oxide varistor.

10. The driver circuit as claimed in claim 1, wherein the pulse width controller comprises:
a feedback input coupled to the output;
a reference input (ref) for receiving a reference; and
a comparator for comparing the reference with the output at the feedback input and determining at least one of said pulse width and said duty cycle of the pulse width modulations therefrom.

11. The driver circuit as claimed in claim 1, comprising an LED driver circuit.

12. A lighting circuit comprising:
a driver circuit as claimed in claim 11; and
an LED arrangement powered by the delivered output.

13. A method of delivering output power, comprising:
converting a mains input and delivering an output by switching the mains input using a pulse width modulation signal;
providing surge protection for surge events arising at the mains input; and
monitoring at least one of a pulse width and a duty cycle of the pulse width modulation signal and detecting a surge event from the pulse width and/or duty cycle, by detecting the surge event from changes in at least one of the pulse width and the duty cycle over time, and detecting a surge event by detecting a change in the pulse width, from a second pulse width changing to a first pulse width, the first pulse width being maintained for a time period falling within a first threshold range and then returning to the second pulse width, wherein the first pulse width is narrower than the second pulse width; or
by detecting a change in the duty cycle, from a second duty cycle changing to a first duty cycle, the first duty cycle being maintained for a time period falling within a first threshold range and then returning to the second duty cycle, wherein the first duty cycle is smaller than the second duty cycle.

* * * * *